United States Patent [19]

Agiman

[11] Patent Number: 4,914,317

[45] Date of Patent: Apr. 3, 1990

[54] ADJUSTABLE CURRENT LIMITING SCHEME FOR DRIVER CIRCUITS

[75] Inventor: Dan Agiman, Lewisville, Tex.

[73] Assignee: Texas Instruments Incorporated, Dallas, Tex.

[21] Appl. No.: 283,104

[22] Filed: Dec. 12, 1988

[51] Int. Cl.[4] ........................ H03K 3/01; H03K 17/00

[52] U.S. Cl. .................................... 307/270; 307/454; 307/455; 307/296.6; 307/310; 323/315; 323/312

[58] Field of Search ................ 307/270, 456, 457–458, 307/296.6, 310, 454–455; 323/315, 312

[56] References Cited

U.S. PATENT DOCUMENTS

| | | | |
|---|---|---|---|
| 4,055,774 | 10/1977 | Ahmed | 307/296 R |
| 4,063,116 | 12/1977 | Schmoock | 307/254 |
| 4,289,977 | 9/1981 | Powers et al. | 307/270 |
| 4,814,724 | 3/1989 | Tanigawa | 323/315 |

*Primary Examiner*—Stanley D. Miller
*Assistant Examiner*—Nancy Thai
*Attorney, Agent, or Firm*—George L. Craig; Thomas W. DeMond; Melvin Sharp

[57] ABSTRACT

An output load drive circuit including circuitry for adjusting a drive circuit bias current during operation in order to control driver circuit stability. The driver further includes circuitry which is self adjusting in response to ambient temperature fluctuations to control the overall gain of the driver.

11 Claims, 2 Drawing Sheets

ADJUSTABLE CURRENT LIMITING SCHEME FOR DRIVER CIRCUITS

BACKGROUND OF THE INVENTION

I. Field of the invention.

The present invention pertains generally to driver circuits and more particularly to adjustable current limiting schemes for driver circuits.

II. Description of the related art.

Two important considerations in designing driver circuits are stability in the control mode and proper functioning in the non-control mode. One factor which influences both operational modes is the open loop gain of the driver circuit. In the case of a high gain driver circuit, high gain is needed for proper functioning in the non-control mode; however, two high a gain will cause instability in the control mode. Prior art techniques of using capacitor compensation at best results in an inefficient use of expensive bar real estate and at worst leads to system reliability problems. Furthermore, compensating a system by generating a delay may stress the device for that time delay period.

An associated problem similar systems incur, is accurate control of the over current limit. Process variations can cause an appreciable fluctuation of this value leading to a tremendous yield loss.

SUMMARY OF THE INVENTION

The above and other problems associated with prior art driver circuits are solved by the present adjustable current limiting scheme. A high-side load driver circuit incorporating the teachings of the present invention may comprise a current source for providing input current drive for the driver circuit; a current adjusting circuit for adjusting the input current; a load drive current regulating circuit for regulating the circuit drive current; a current coupling circuit for coupling the circuit drive current to the load drive current regulating circuit; and an output driver circuit for providing the desired load drive current to an output load. The present invention controls the open loop gain to the point of circuit stability in the control mode.

BRIEF DESCRIPTION OF THE DRAWING FIGURES

Further features and advantages of the present invention will become more apparent from the following and more particular description of the various embodiments of the invention, as illustrated in the accompanying drawing, wherein.

DETAILED DESCRIPTION OF THE PREFERRED EMBODIMENTS

Figure 1:
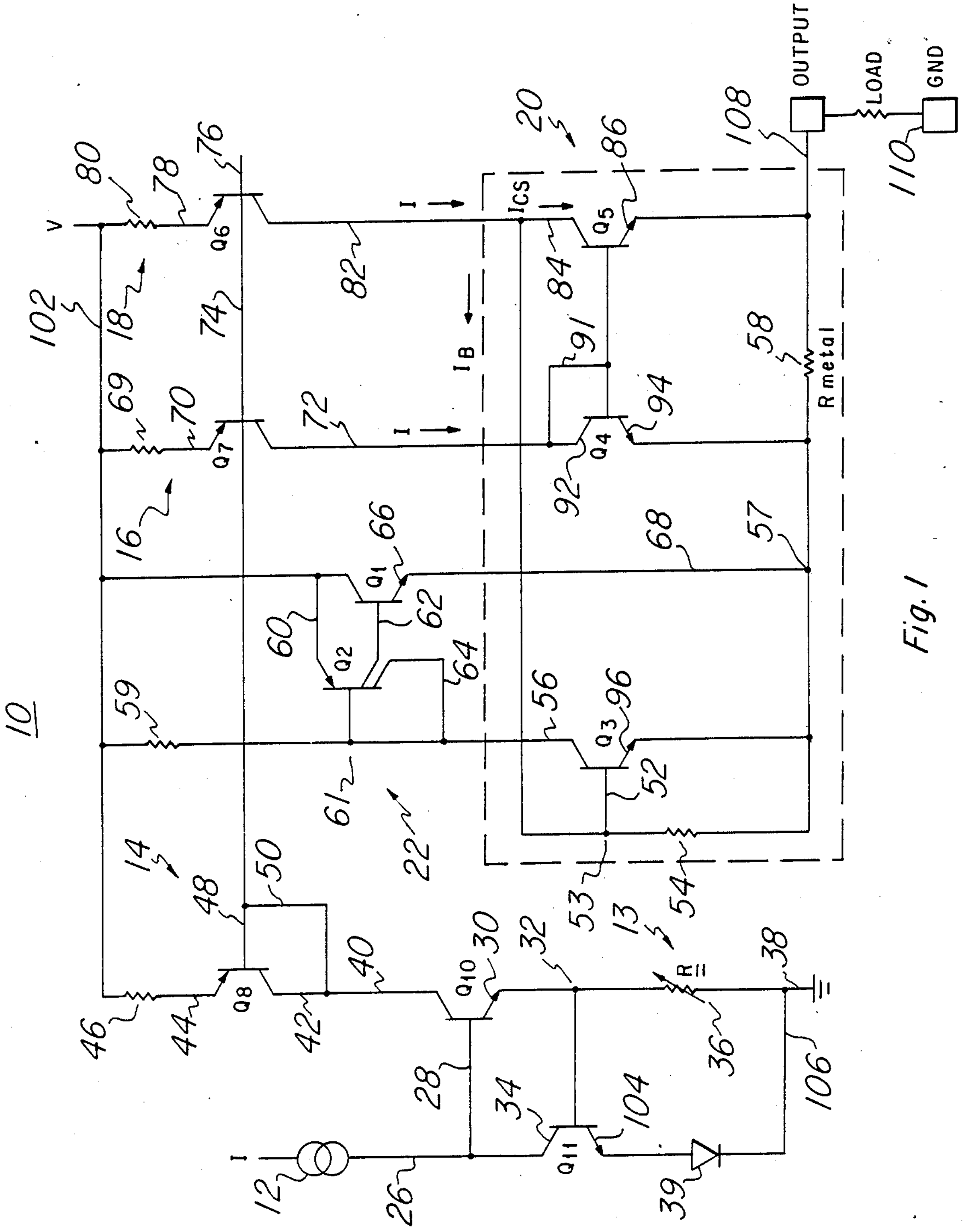
FIG. 1 is a schematic circuit diagram of a high-side load driver circuit incorporating the current limiting scheme of the present invention.

Referring now to drawing FIG. 1, there is illustrated a schematic diagram of a high-side load driver circuit incorporating a preferred embodiment of the present adjustable current limiting scheme. As illustrated in FIG. 1, load driver circuit 10 includes current source 12 for providing input current drive for the driver circuit 10; current adjusting circuit 13 for adjusting the input current; load drive current regulating circuit 20 for regulating the circuit drive current; current coupling circuit 14 for coupling the circuit drive current to the load drive current regulating circuit 20; and output driver circuit 22 for providing a desired load drive current to an output load.

Current source 12 may comprise any suitable means for supplying sourced current to a circuit. Current source 12 is illustrated having its current output provided via lead 26 to an input of current adjusting circuit 13. In accordance with the teachings of the present invention, the preferred embodiment of circuit 13 is illustrated comprising transistors $Q_{11}$ and $Q_{10}$, diode 39, and variable resistor 36. The base of $Q_{10}$ and collector of $Q_{11}$ are connected at node 26 to the sourced current. Emitter 30 of $Q_{10}$ is connected to the base node 32 of transistor $Q_{11}$, and to one side of variable resistor R36. The opposite side of R36 is connected to ground node 38. Emitter 104 of $Q_{11}$ is coupled via diode 39 to the opposite side of $R_{36}$ and to ground node 38. collector 40 of $Q_{10}$ is connected to collector 42 of collector-base clamped PNP transistor $Q_8$.

Current coupling circuit 14 is shown comprising PNP transistor $Q_8$ having its emitter 44 coupled through resistor R46 to 12 volt battery supply line 102; first current mirror 16 comprising a PNP transistor $Q_7$ having its emitter 70 coupled through resistor R69 to battery supply line 102, and its collector 72 connected to collector node 2 of transistor $Q_4$; and second current mirror 18 comprising a similar PNP transistor $Q_6$ having its emitter 78 coupled through a resistor 80 to battery supply line 102 and its collector 82 connected to collector node 85 of transistor $Q_5$. The bases of transistors $Q_6$, $Q_7$ and $Q_8$ are tied together in common.

The load drive current regulating circuit 20 is shown comprising transistors $Q_3$, $Q_4$, and $Q_5$ and metal resistor $R_{58}$. Base 52 of $Q_3$ is coupled through resistor R54 to its emitter 96 and to line 57. Collector 92 of $Q_4$ is connected to collector 72 of $Q_7$ and to its own base 90 and to the base 88 of transistor $Q_5$. Emitter 94 of $Q_4$ is connected to line 57 and through a low value resistor R58, such as a metal resistor, to emitter 86 of $Q_5$.

The output driver 22 is shown comprising transistors $Q_1$ and $Q_2$. $Q_2$ is illustrated in a multiple collector PNP transistor configuration, having one collector 64 connected to its own base 61 through resistor R59 to supply line 102. Emitter 60 of $Q_2$ is connected to collector 65 of $Q_1$ and to supply line 102. Base 62 of $Q_1$ is connected to the second collector 61 of $Q_2$. Emitter 66 of $Q_1$ is connected to line 57. Transistor $Q_2$ has approximately a 40:1 ratio between its collectors. This ratio places transistor $Q_2$ in a forced gain mode.

In operation of the above described circuit, current source 12 sources current to base/collector node 28 of transistors $Q_{10}$ and Q11. The sourced current causes $Q_{10}$ to conduct and drive current through variable resistor $R_{36}$. When the voltage across $R_{36}$ at node 32 exceeds 2 Vbe, the collector of transistor $Q_{11}$ will turn on shutting off transistor $Q_{10}$ and thus regulating the voltage at node 32 at 2 Vbe in this embodiment. Idrive, the circuit drive current, is equal to the voltage at node 32 (2 Vbe) divided by variable resistance $R_{36}$. In accordance with the teachings of the present invention, Idrive is a temperature dependent current which compensates for the circuit loop gain variation temperature, yielding a nearly constant Idrive-loop gain product.

Idrive is drawn from collector 42 of transistor $Q_8$, which acts to couple the drive current value through current mirror transistors $Q_7$ and $Q_6$. If identical valued resistors are employed for $R_{69}$ and $R_{80}$ as $R_{46}$, collector current values I1 and I2 from respective current mirrors 16 and 18 will be identical to Idrive.

Under normal load conditions, mirrored currents I1 and I2 are conducted into respective collectors 92 and 84 of transistors $Q_4$ and $Q_5$. Transistor $Q_4$has an emitter area four times the emitter area of $Q_5$. The emitter area ratio in conjunction with Rmetal 58 are a factor in regulating the over current limit value of the drive circuit. When mirrored current I1 is supplied to the bases of transistor $Q_4$ and $Q_5$, at node 91, transistor $Q_4$ will conduct full current and force $Q_5$ to conduct only 0.25 the amount of current as $Q_4$. Thus 0.75 I2 is provided to base node 53 of transistor $Q_3$. This current provides sufficient drive to turn on Q3 which conducts collector current to turn on predriver transistor $Q_2$ of output driver circuit 22. This turns on output drive transistor $Q_1$ which drives current into node 57 and across resistor R58 to output pin 108, to supply load drive current. This output drive action will continue until the voltage across the output load rises to the point where the collector emitter voltage of $Q_3$ is reduced to the point of saturation. This occurs when the collector voltage of $Q_3$ drops below the base of $Q_3$. This is in effect a reduction in the transistor action of $Q_3$. The beta of $Q_3$ is deteriorating rapidly and the gain is reduced and accordingly the predrive current is reduced and the circuit stabilizes at the desired voltage and current values for a given load. As long as the drive current is below the specification current required for operation, the output current will be low to allow for as much current upswing as needed to supply the load.

In a shorted load condition, the initial conduction of current into the colectors of $Q_4$ and $Q_5$ is the same as described with respect to normal load conditions. When the load is first shorted, the driver transistor $Q_1$ current has not reached the shorted over current limit. At this time $Q_4$ conducts I1 and $Q_5$ conducts 0.25 I2 as previously discussed. This results in 0.75I2 being diverted into the base of $Q_3$ to turn it on.

The base drive current of $Q_3$(0.75 I2) is multiplied by the current gain factor, beta, of $Q_3$. Thus $Q_3$ pulls down 0.75 I2 times from the collector of $Q_2$ causing it to conduct current and eventually turn on driver transistor $Q_1$ to supply load current. As the load current increases the voltage across $R_{58}$ increases, increasing $Q_4$ emitter voltage. This in turn, increases the base emitter voltage of $Q_5$ forcing it to turn on harder and divert current away from base 52 and $Q_3$. This conductive action continues until the drive current from $Q_1$ to output 108 arrives at the over current limit. This threshold value is mainly determined from delta Vbe of transistors $Q_5$ and $Q_4$ divided by Rmetal 58. When this limit is reached, $Q_5$ turns on harder, sinking more and more current in relationship to I1. This reduces the base current to transistor $Q_3$, which in turn reduces the output current to a level where delta Vbe/Rmetal is maintained constant. This is the threshold value where we are sensing the output current limit and transistors $Q_4$ and $Q_5$ are regulating the output current. This occurs because the base current of $Q_3$ is reduced eventually causing less current output of $Q_1$.

A design consideration of output drive circuits is that under normal load conditions when low output voltage drop is required, the headroom is limited. It has been shown that under limited headroom the Hfe of the device is as low as 0.5 of the shorted condition headroom. This is an important consideration in an output driver design since under normal load conditions drive is needed to achieve a satisfactory V "on". In a shorted load condition, however, there is no headroom problem because the output is shorted to ground. This results in doubling current gain of $Q_3$ and $Q_4$, Quadrupling the overall gain, rendering the circuit unstable in the over current limit control mode. This stability problem is corrected, in accordance with the teachings of the present invention, by the incorporation of variable resistor R36. An increase in $R_{36}$ will reduce $I_d$, $I_1$, and $I_2$, decreasing the transconductance gm of $Q_5$. This will reduce the overall short circuit control loop gain and stabilize the circuit. In the case of a high-side driver, the short circuit current limit is rated twice as high as the normal load current. This wide of a window allows adjustment of $R_{36}$ to reduce circuit drive in the current limit control loop to the point of open loop, while maintaining low output voltage drop in the normal drive mode. This renders the current limit control loop unconditionally stable.

In addition to stabilizing the circuit, adjustable resistance $R_{36}$ can be used to compensate for process and beta variations in the fabricated circuit.

When not in the current limit mode $Q_3$ is fully on turning on $Q_2$ and $Q_1$. At Iout equal to Vbe/R $Q_5$ begin to regulate base current to $Q_3$, thus allowing adjustability of Iout.

Figure 2:
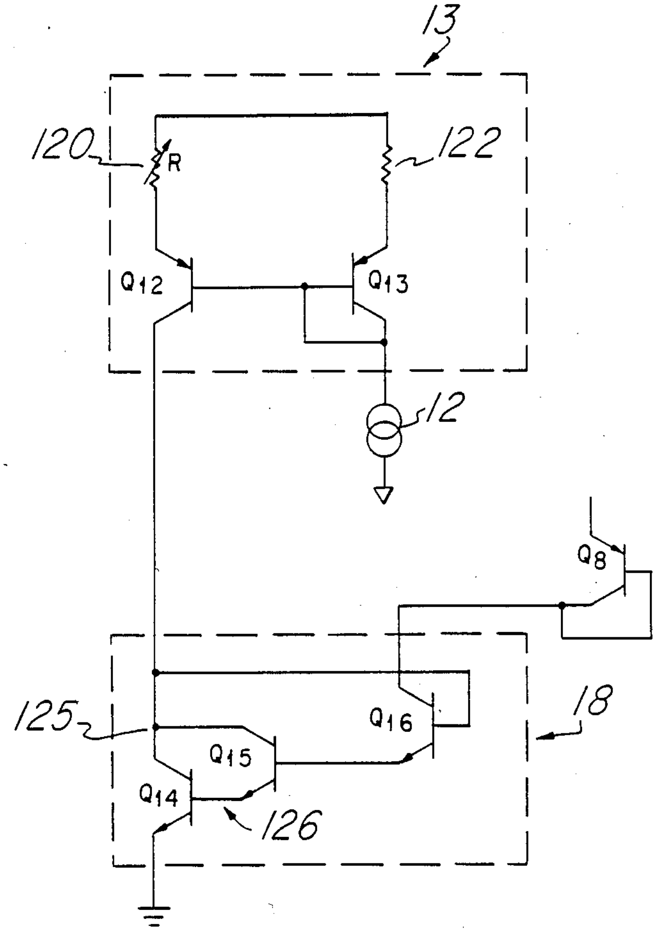
FIG. 2 is a schematic circuit diagram of alternative embodiments of components of the present invention.

Referring now to drawing FIG. 2, there is illustrated a schematic diagram of an alternative embodiment of the present invention. As illustrated in FIG. 2, the current adjusting circuit 13 depicted in FIG. 1 may comprise the two transistor configuration depicted in FIG. 2. The alternative embodiment may also include temperature compensation circuit 18 coupled to temperature constant bias current source 12 and current adjusting circuit 13. Current adjusting circuit 13 includs means such as a variable resistor 120 for adjusting the current and is operable in accordance with the teachings of the present invention for controlling the stability of the driver circuit. In operation of this embodiment bias current provided by current source 12 is pulled from transistor $Q_{13}$ and is mirrored by transistor $Q_{12}$ and provided to node 125 of circuit 18. It is considered that $Q_{12}$ may be a larger emitter area transistor than $Q_{13}$. This will allow for further amplification of bias current 12. Adjustment of the current level may be made by adjusting the value of variable resistor 120. Of course it should be appreciated that a variable resistor need not be employed. It is recognized that any of many well known methods for varying resistance maybe employed to achieve the same desired effect of controlling the mirrored current value. The current provided to node 125 is pulled to ground through the conduction path of transistor $Q_{14}$. To maintain circuit equilibrium the pull down current divided by beta squared must be conducted through transistor $Q_{16}$. This current value is also provided to the base of transistor $Q_8$ as previously described herein above. In this embodiment $Q_8$ may be a larger emitter area transistor to allow for further amplification of the bias current. As the temperature varies affecting the circuit, the beta values of transistors $Q_{14}$, $Q_{15}$and $Q_{16}$ also vary such to maintain circuit stability.

The present embodiment maintains driver circuit stability by allowing for adjustability of the current provided to the load drive current regulating circuit 20 in a manner similar to the embodiment of FIG. 1. It should be appreciated that temperature compensation and circuit stability may be separate and independent functions of the invention.

Figure 3:
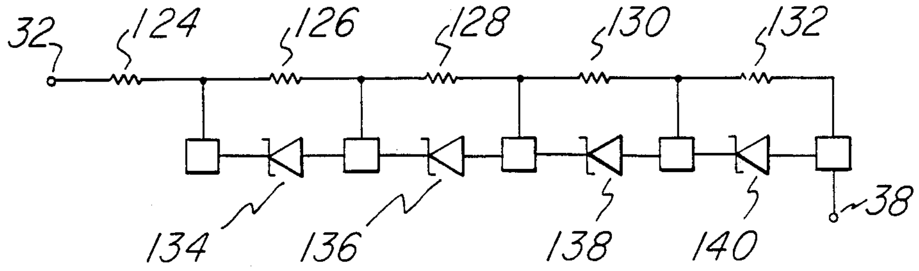
FIG. 3 is a schematic circuit diagram of a adjustable resistance circut for utilization with the present invention.

Referring now to FIG. 3, there is depicted an alternative circuit for vriably controlling resistance. Such circuit may for example replace variable resistor 36 of FIG. 1. or variable resistor 120 of FIG. 2. Incorporation into the FIG. 1 embodiment is illustrated connecting like numbered nodes 32 and 38 of FIG. 3 with those of FIG. 1.

TECHNICAL ADVANTAGES OF THE INVENTION

From the foregoing the construction of a high gain driver circuit with accurate adjustable current limiting capabilities is disclosed. A technical advantage of the disclosed in vention is that the adjustable aspec tof the circuit allows for post device fabrication adjustment of the open loop circuit gain. This is an extremely important feature the fact that uniformity of operation between devices is necessary to meet specification requirements. An attendant technical advantage of controlling the open loop gain is that high gain can be achieved for proper functioning in the non-control mode with out rendering the circuit unstable in the control mode.

An additional technical advantage of the present circuit is that the circuit over current limit can be controlled and adjusted to compensate for variations in device fabrication process flows. Thus an attendant advantage is that there is a reduction in yield loss due to specification variations.

Another technical advantage of the present circuit is self compensating to correct for changes in circuit characteristics due to external temperature extremes.

Although a preferred embodiment of the present invention has been described in detail, it should be understood that various changes, substitutions and alterations can be made throughout without departing from the scope and spirit of the invention as defined by the appended claims.

What is claimed:

1. A circuit for driving an output load, comprising:

current source for providing input drive current for said circuit;

current adjusting circuit for adjusting said input drive current to establish and maintain a desired circuit drive current;

load drive current regulating circuit for sensing said circuit drive current and subsequently regulating said circuit drive current at a desired load driving value;

current coupling circuit for providing said input drive current as input to said load drive current regulating circuit; and output driver circuit for providing said desired load drive current to said output load.

2. The circuit of claim 1, wherein said current adjusting circuit includes a variable resistor.

3. The circuit of claim 1, wherein said current adjusting circuit stabilizes said circuit in response to temperture variations.

4. The circuit of claim 3, wherein said current adjusting circuit comprises, a first transistor having a collector connected to said current source, an emitter coupled through a diode to a ground potential, and a base coupled through a varable resistance means to said ground potential, a second transistor having a base connected to said collector of said first transistor, an emitter connected to said base of said first transistor, and a collector coupled to said current coupling means.

5. The circuit of claim 1, wherein said load drive current regulating circuit includes amplification means receiving said circuit drive current from said current coupling circuit and providing an amplified value of said circuit drive current to said output driver circuit.

6. The circuit of claim 1, wherein said current adjusting circuit provides open loop gain reduction to stabilize said circuit.

7. A driver circuit comprising:

adjustable current control circuitry for adjusting a circuit bias current to provide a desired circuit driving current;

output driving circuitry for driving an output load; and output drive regulating circuitry responsive to receipt of said circuit driving current to supply current to said output driving circuitry, said output drive regulating circuitry coupled between said adjustable current control circuitry and said output driving circuitry, and stabilizing said driver circuit in response to current adjustments.

8. The driver circuit of claim 7, further comprising; compensation circuitry coupled to said adjustable current control circuitry to further stabilize said driver circuit in response to external temperature variations.

9. The driver circuit of claim 7, wherein said adjustable current control circuitry includes resistance means for variably controlling its resistance to current flow thereby enabling various degrees of adjustment of said bias current.

10. The driver circuit of claim 9, wherein said resistance means comprises a variable resistor.

11. The driver circuit of claim 9, wherein said resistance means comprises a circuit network including zener diodes and resistors, said network being operable to short out undesired resistors in order to achieve a desired resistance.

* * * * *